(12) United States Patent
Wang et al.

(10) Patent No.: US 7,260,126 B2
(45) Date of Patent: Aug. 21, 2007

(54) OPTICAL PULSES EMITTER

(75) Inventors: Dongning Wang, Kowloon (HK); Xiaohui Fang, Kowloon (HK); Wei Jin, Kowloon (HK)

(73) Assignee: The Hong Kong Polytechnic University, Hong Kong SAR (HK)

( * ) Notice: Subject to any disclaimer, the term of this patent is extended or adjusted under 35 U.S.C. 154(b) by 284 days.

(21) Appl. No.: 11/004,238

(22) Filed: Dec. 6, 2004

(65) Prior Publication Data

US 2006/0120417 A1 Jun. 8, 2006

(51) Int. Cl.
*H01S 3/13* (2006.01)
(52) U.S. Cl. .......................................... 372/30; 372/31
(58) Field of Classification Search .................. 372/30, 372/31
See application file for complete search history.

(56) References Cited

U.S. PATENT DOCUMENTS 7,027,471 B2* 4/2006 Chi et al. ..................... 372/20
2002/0044574 A1* 4/2002 Abedin .......................... 372/18
2004/0213574 A1* 10/2004 Han et al. ....................... 398/71
2004/0264514 A1* 12/2004 Kim ............................. 372/20

* cited by examiner

*Primary Examiner*—Dung (Michael) T. Nguyen
(74) *Attorney, Agent, or Firm*—Jacobson Holman PLLC

(57) ABSTRACT

An optical pulses emitter includes a first and a second Fabry-Perot laser diodes. The first and second laser diodes have a first and second working optical wavelength band respectively, and the first and second working wavelength bands has at least an overlapped wavelength band. The emitter also includes a signal source in connection with the first laser diode such that a plurality of optical pulses over the first working optical wavelength band is generated and an optical filter for filtering the optical pulses so as to output a plurality of optical pulses primarily of a desired optical wavelength, which falls into the overlapped wavelength band. The emitter further includes an optical amplifier along an optical path between the first and second Fabry-Perot laser diodes for amplifying the optical signals passing therethrough. The optical pulses primarily of the desired optical wavelength are injected into the second laser diode, and the second laser diode, stimulated by the injected optical signals, outputs optical pulses primarily of the desired optical wavelength.

12 Claims, 8 Drawing Sheets

OPTICAL PULSES EMITTER

BACKGROUND

1. Field of the Invention

The present invention relates to apparatus for generating optical pulses primarily of a desired optical wavelength, which can be continuously tunable over a wavelength band.

2. Background of the Invention

Various mechanisms have been proposed to generate wavelength-tunable optical short pulses. The light source that can be used for such purpose includes fiber laser and semiconductor laser diode. The fiber laser supports a continuous wavelength tuning in a wide wavelength band and at a high repetition frequency and therefore is one of the favorable choices. However, its stability is liable to small environmental changes, especially when a long laser cavity is involved. Some other conventional designs use the distributed feedback (DFB) laser diode, which exhibits stable laser operation with continuous wavelength tuning capability. However the DFB laser diode has very narrow tuning range, in other words, the tunable wavelength band is limited, typically less than 2 nm. In addition, both the fiber laser and the DFB laser diode are expensive, which may not be desirable.

Fabry-Perot (FP) laser diode is another possible choice for its relatively low cost, larger wavelength tuning range as compared to the DFB laser diode, and better operation stability as compared to the fiber laser. However, owing to the cavity structure of the FP laser diode, conventionally, the tuning of the wavelength of the output short pulses is usually implemented on a mode-to-mode basis, i.e., the smallest wavelength tuning is limited by the mode spacing of the FP laser diode. This essentially limits the application of the FP laser diode in optical fiber communication in that the mode of the FP laser diode may not coincide with one of the ITU grid wavelengths. Although a smaller wavelength shift or tuning than the mode spacing of the FP laser diode can be achieved by use of thermal control, such an operation can be affected by mode hopping when a large wavelength tuning range is required.

OBJECT OF THE INVENTION

Therefore, it is an object of the present invention to provide an improved apparatus for relatively conveniently generating optical pulses primarily of a desired optical wavelength, which wavelength can be continuously tunable over a wavelength band, or at least provide the public with a useful choice.

SUMMARY OF THE INVENTION

According to an aspect of present invention, an optical pulses emitter includes a first and a second Fabry-Perot laser diodes. The first and second laser diodes have a first and second working optical wavelength band respectively, and the first and second working wavelength bands has at least an overlapped wavelength band. The emitter also includes a signal source in connection with the first laser diode such that a plurality of optical pulses over the first working optical wavelength band is generated and an optical filter for filtering the optical pulses so as to output a plurality of optical pulses primarily of a desired optical wavelength, which falls into the overlapped wavelength band. The emitter further includes an optical amplifier along an optical path between the first and second Fabry-Perot laser diodes for amplifying the optical signals passing therethrough. The optical pulses primarily of the desired optical wavelength are injected into the second laser diode, and the second laser diode, stimulated by the injected optical signals, outputs optical pulses primarily of the desired optical wavelength.

According to a second aspect of the present invention, optical pulses emitter includes
- a first and a second Fabry-Perot laser diodes having a first and second working optical wavelength band respectively, the first and second working wavelength bands having at least an overlapped wavelength band; and
- a first tunable optical filter, a fiber amplifier, and a second tunable optical fiber optically connected in series for receiving the first plurality of optical pulses from the first laser diode and for outputting a second plurality of optical pulses primarily of a desired optical wavelength, which falls into the overlapped wavelength band, and of a desired amplitude,
- wherein the second plurality of optical pulses is externally injected into the second laser diode for generating optical pulses primarily of the desired optical wavelength. The first optical filter is tunable such that the desired optical wavelength is tunable. For example, the first optical filter can be a tunable fiber Bragg grating.

According to a further aspect of the present invention, a process for generating a plurality of optical pulses primarily of a desired wavelength includes
- providing a first and a second Fabry-Perot laser diodes having a first and second working optical wavelength band respectively, the first and second working wavelength bands having at least an overlapped wavelength band, into which the desired wavelength falls;
- controlling the first laser diode to generate a plurality of optical pulses over the first working optical wavelength band;
- filtering the plurality of optical pulses from the first laser diode for generating a plurality of optical pulses primarily of the desired optical wavelength;
- amplifying the plurality of optical pulses primarily of the desired optical wavelength;
- injecting the amplified optical pulses into the second laser diode; and
- outputting a plurality of optical pulses primarily of the desired wavelength by the second laser diode as stimulated by the injected optical pulses.

Other aspects and advantages of the invention will become apparent from the following detailed description, taken in conjunction with the accompanying drawings, which description illustrates by way of example the principles of the invention.

DETAILED DESCRIPTION

Figure 1:
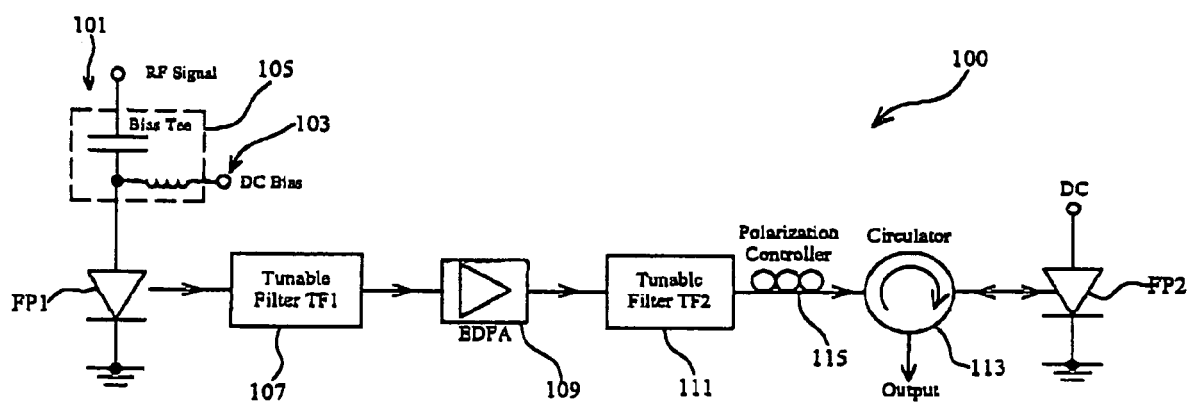
FIG. 1 is a block diagram illustrating an exemplary optical pulses emitter embodiment of the present invention.
Figure 2:
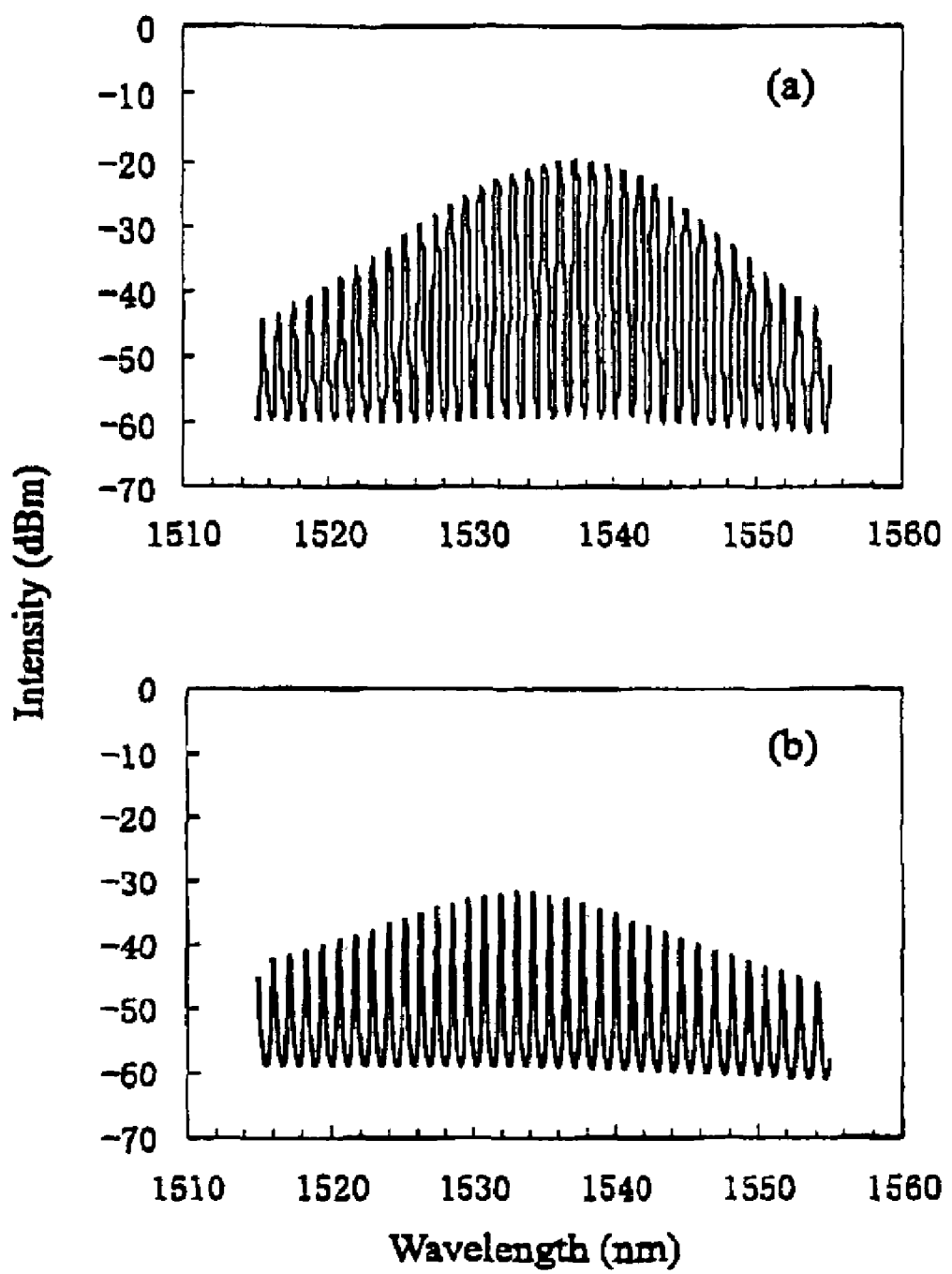
FIG. 2(a) illustrates the optical spectra of the output of one of the FP laser diode FP1 of the emitter of FIG. 1.
FIG. 2(b) illustrates the optical spectra of the output of the other FP laser diode FP2 of the emitter of FIG. 1.
Figure 3:
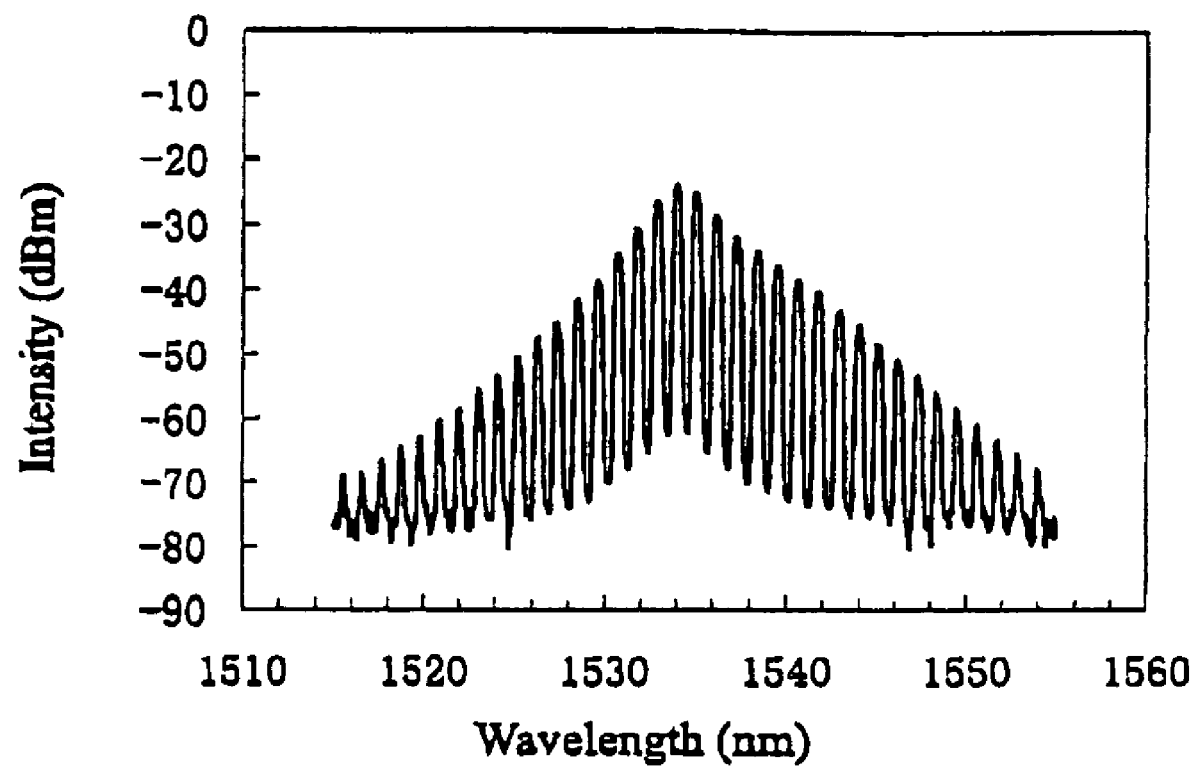
FIG. 3 illustrates the optical spectra of the output of one of the tunable optical filter of the emitter of FIG. 1.
Figure 4:
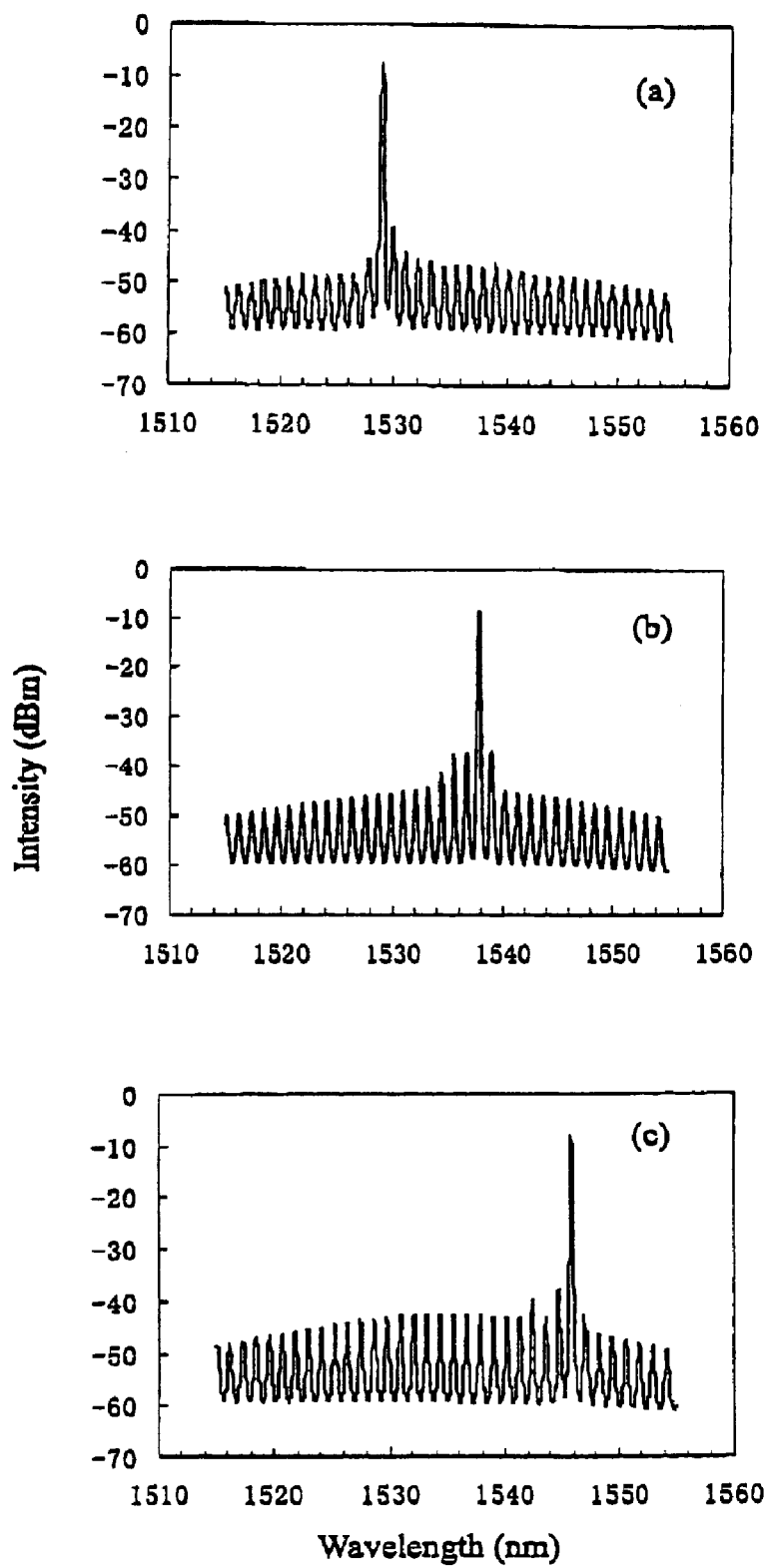
FIGS. 4(a)-(c) illustrate the output pulse spectra for the wavelengths of 1528.8 nm, 1537.8 nm and 1545.8 nm respectively, situated at the laser mode of FP1.
Figure 5:
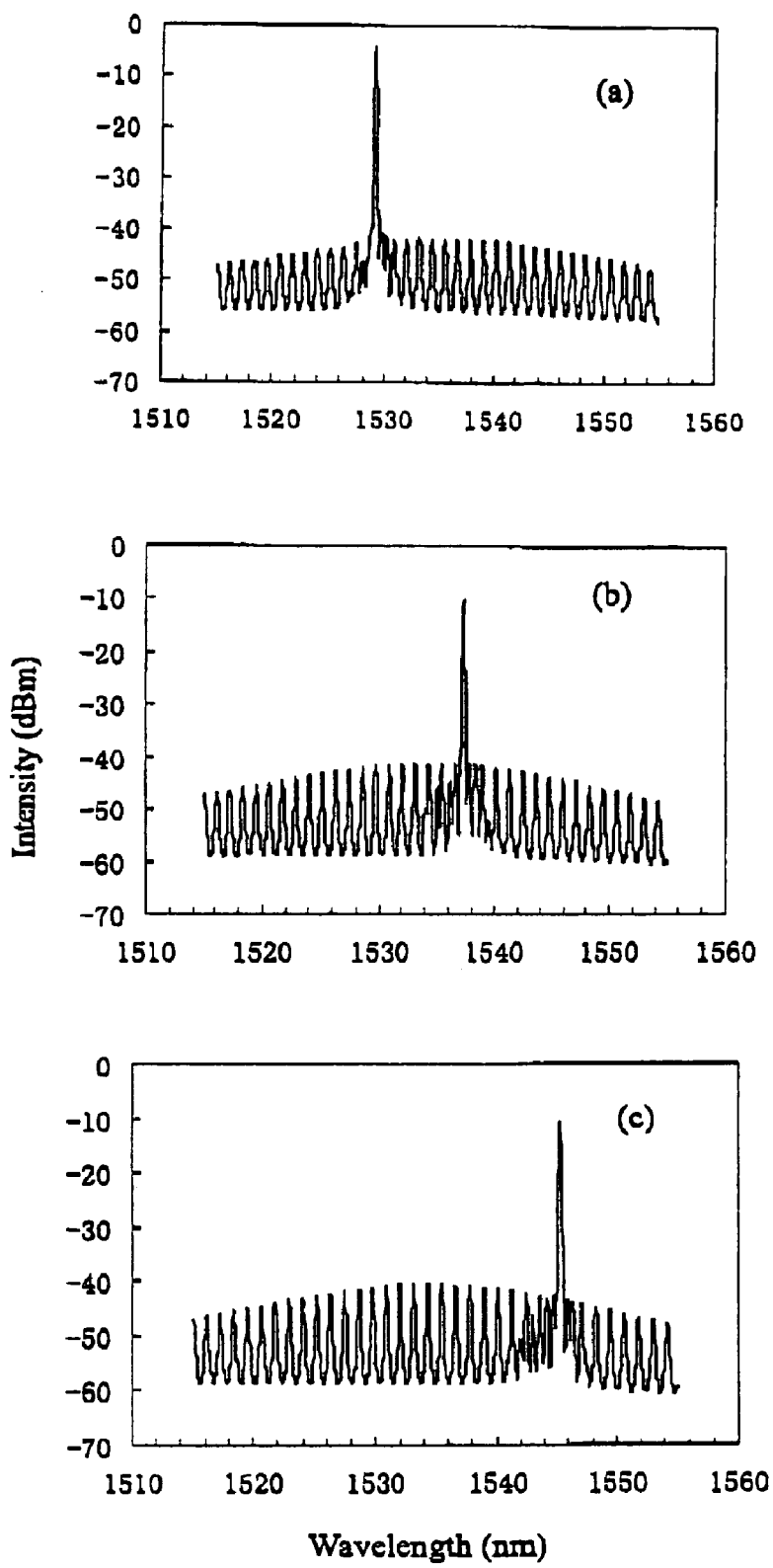
FIGS. 5(a)-(c) illustrate the output pulse spectra for the wavelengths of 1529.1 nm, 1537.3 nm and 1545.3 nm respectively, near the center of two adjacent modes of FP1.
Figure 6:
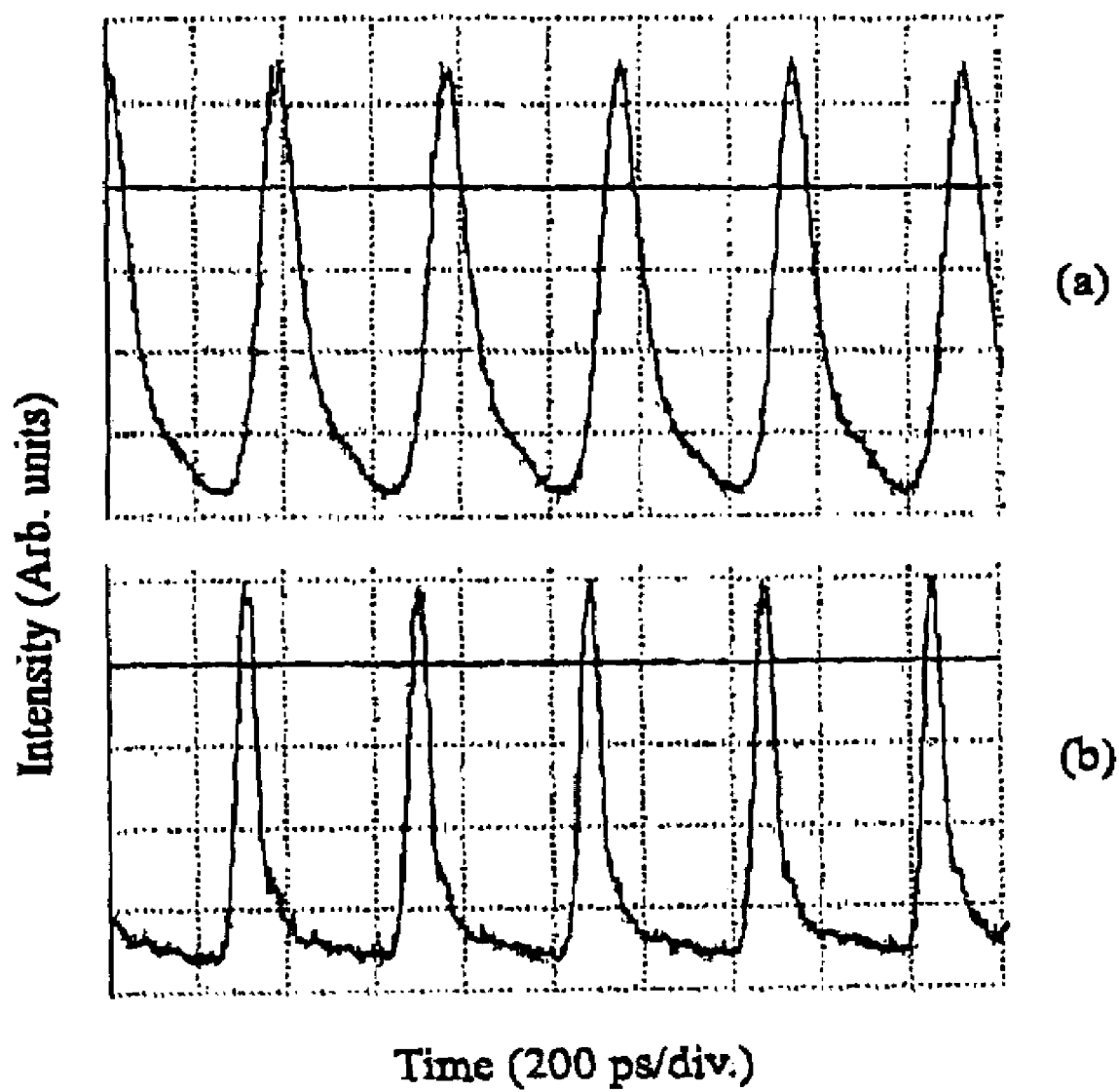
FIGS. 6(a) and 6(b) illustrate the waveforms of the output optical pulse trains of the emitter of FIG. 1 at the wavelengths of 1537.8 nm and 1537.3 nm respectively.
Figure 7:
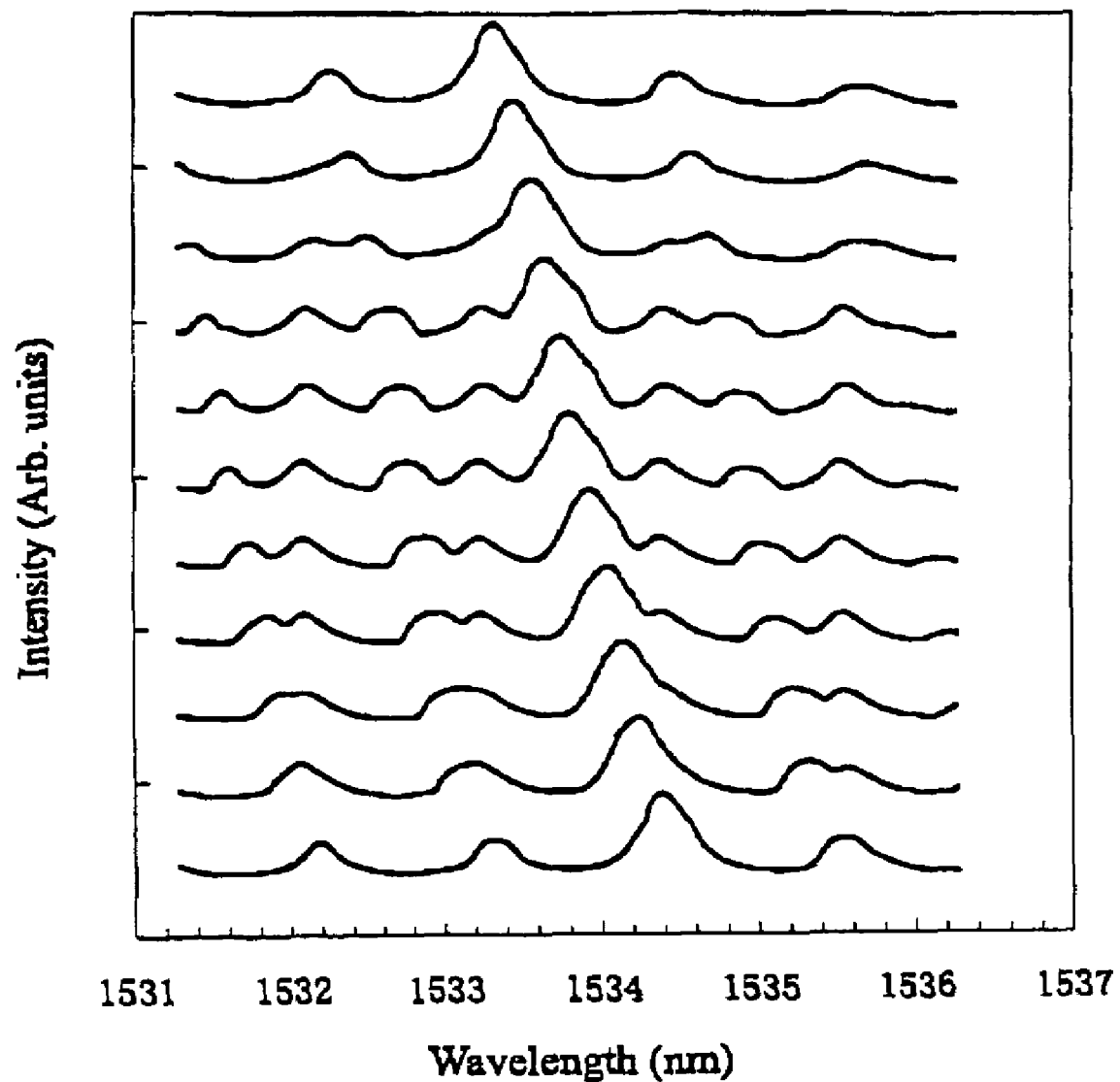
FIG. 7 illustrates the output spectra of a continuous wavelength-tuning in a small region between 1533.3 and 1534.4 nm.
Figure 8:
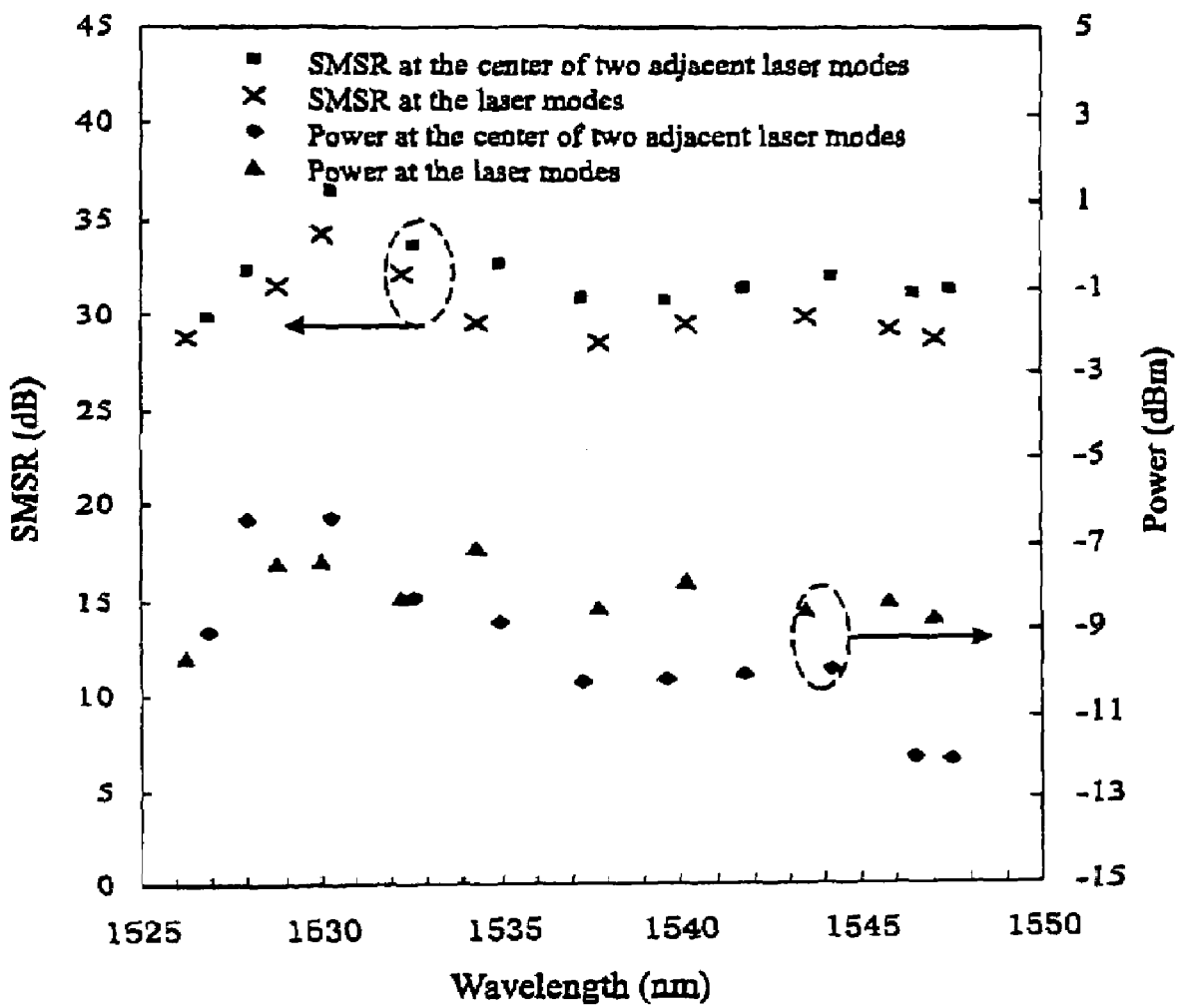
FIG. 8 illustrates the measured SMSR and average output power of the optical pulses in the wavelength tuning range.

FIG. 1 illustrates an optical pulses emitter 100 according to an exemplary embodiment of the present invention. In FIG. 1, a first commercial FP laser diode (hereinafter FP1) with a central wavelength of 1537 nm and a threshold current of approximately 15 mA is gain-switched by the use of a radio frequency (RF) electric signal 101 in conjunction with a DC bias current 103 of approximately 14 mA via a bias-tee circuit 105. As generally understood in the art, controlled by the RF signals, FP1 outputs a plurality of optical short pulses over an optical wavelength band the same as its working wavelength band. The RF electrical signal power used to modulate FP1 is approximately 12 dBm.

The output from FP1, which is a gain-switched FP laser diode and acts as a master source in the exemplary embodiment, is firstly directed to a tunable optical bandpass filter (hereinafter TF1) 107 with a bandwidth of approximately 1 nm before the optical short pulses are power amplified by an erbium-doped fiber amplifier (hereinafter EDFA) 109 with the gain of approximately 25 dB in the exemplary embodiment. Various commercially available tunable optical filters can be used, and the exemplary embodiment uses TB 1570, available from JDS FITEL. In this exemplary embodiment, TF1 functions to perform a rough wavelength selection and to reduce the DC level of the output signals.

Thereafter, the enhanced wavelength elements from the EDFA 109 are directed to a tunable optical FP filter (hereinafter TF2) 111 with a bandwidth of 2.4 GHz and a free spectral range of 8860 GHz to perform a fine wavelength selection for selecting a desired optical wavelength. As could be understood in the art, TF2 outputs a plurality of optical short pulses primarily of the desired optical wavelength.

These optical signals are then launched to or injected into the slave source, i.e., a DC biased FP laser diode (FP2), via a circulator 113 in the exemplary embodiment. As understood in the art, being stimulated by the injection optical signals from TF2, FP2 outputs a plurality of optical short pulses primarily of the desired optical wavelength. Such external-injection seeded output optical pulses are extracted from one of the circulator 113 output ports. It can be understood that by adjusting the pair of tunable filters, the optical wavelength of the output short pulses can be tuned accordingly.

In addition, a polarization controller 115 can be arranged after TF2 in a direction, along which the optical signals travel. The polarization controller 115 functions to optimize the polarization states of the optical pulses and to improve the sidemode suppression ratio (SMSR) of the output signals of the emitter 100.

As could be appreciated by a skilled person in the art, the exemplary emitter 100 produces the optical short pulses of primarily desired optical wavelength by using the external-injection seeding method. The cost is significantly reduced through the use of the pair of FP laser diodes. The use of a pair of tunable optical filters assures a fine tuning of the optical wavelength of the output pulses. The EDFA assists the continuously tuning of the optical wavelength of the output signals basically over the working wavelength band of the FP laser diodes in that it assures the optical signals launched to, or injected into, FP2 to be of a desired amplitude. In short, the use of the FP laser diodes reduces the cost, while the use of the tunable optical filter(s) and the fiber amplifier allows the continuous tuning of the wavelength of the output optical pulses over a fairly broad wavelength band, which is substantially consistent with the relatively large working wavelength band of the FP laser diodes in the exemplary embodiment.

It can also be understood that the two FP laser diodes can have different working wavelengths bands so long as they have at least an overlapped wavelength band. In this case, this overlapped wavelength band is substantially the continuous tuning range of the wavelength of the output optical pulses.

Various modifications can be made. For example, instead of two tunable optical filters, one tunable optical filter can be used. Other optical components, such as couplers or beam splitters, can be used to replace the circulator, which functions to inject the optical signals from TF2 into FP2 and to direct the output signals from FP2 in the exemplary embodiment. Furthermore, it could be understood that in a case, in which the injection signals from TF2 are directed into FP2 at an angle to the center axis of the output signals of FP2, the circulator may not be necessary though in such a case, the efficiency of the emitter can be affected.

What is claimed is:

1. An optical pulses emitter, comprising
   a first and a second Fabry-Perot laser diodes having a first and second working optical wavelength band respectively, the first and second working wavelength bands having at least an overlapped wavelength band;
   a signal source in connection with the first laser diode such that a first plurality of optical pulses over the first working optical wavelength band is generated;
   a first optical filter, a fiber amplifier and a second optical filter connected optically in series for receiving the first plurality of optical pulses from the first laser diode and for outputting a second plurality of optical pulses primarily of a desired optical wavelength, which falls into the overlapped wavelength band and of a desired amplitude, wherein the first optical filter and the second optical filter are tunable relative to each other, and
   wherein said second plurality of optical pulses is externally injected into the second laser diode for generating optical pulses primarily of the desired optical wavelength.

2. The emitter of claim 1, further comprising a radio-frequency signal source in conjunction with a DC bias current via a bias-tee circuit for gain-switching the first laser diode.

3. The emitter of claim 1, wherein the first optical filter is tunable such that the desired optical wavelength is tunable.

4. The emitter of claim 3, wherein the first optical filter is a tunable fiber Bragg grating.

5. The emitter of claim 1, further comprising a polarization controller along an optical path between the first laser diode and a circulator for optimizing a polarization state of the optical signals passing therethrough.

6. The emitter of claim 1, further comprising means for injecting said optical pulses primarily of the desired optical wavelength into the second laser diode and for directing the output optical pulses from the second laser diode out of the emitter.

7. The emitter of claim 6, wherein said means includes a circulator, which is positioned along the optical path before the second laser diode, though which said optical pulses primarily of the desired optical wavelength are injected into the second laser diode, and through which the output optical pulses from the second laser diode are directed out of the emitter.

8. The emitter of claim 6, wherein said means includes a coupler, which is positioned along the optical path before the second laser diode, though which said optical pulses primarily of the desired optical wavelength are injected into the second laser diode, and through which the output optical pulses from the second laser diode are directed out of the emitter.

9. The emitter of claim 6, wherein said means includes a beam splitter, which is positioned along the optical path before the second laser diode, though which said optical pulses primarily of the desired optical wavelength are injected into the second laser diode, and through which the output optical pulses from the second laser diode are directed out of the emitter.

10. An optical pulses emitter, comprising:
a first and a second Fabry-Perot laser diodes having a first and second working optical wavelength band respectively, the first and second working wavelength bands having at least an overlapped wavelength band; and
a first tunable optical filter, a fiber amplifier, and a second tunable optical filter optically connected in series for receiving the first plurality of optical pulses from the first laser diode and for outputting a second plurality of optical pulses primarily of a desired optical wavelength, which falls into the overlapped wavelength band, and of a desired amplitude, wherein the second plurality of optical pulses is externally injected into the second laser diode for generating optical pulses primarily of the desired optical wavelength.

11. The emitter of claim 10, wherein the first tunable optical filter is designed to perform a rough wavelength selection, and wherein the second tunable optical filter is designed to perform a fine wavelength selection as compared to the first tunable optical filter.

12. A process for generating a plurality of optical pulses primarily of a desired wavelength, comprising
providing a first and a second Fabry-Perot laser diodes having a first and second working optical wavelength band respectively, the first and second working wavelength bands having at least an overlapped wavelength band, into which the desired wavelength falls;
controlling the first laser diode to generate a first plurality of optical pulses over the first working optical wavelength band;
filtering the first plurality of optical pulses from the first laser diode by a first optical filter, a fiber amplifier and a second optical filter connected optically in series for generating a second plurality of optical pulses primarily of the desired optical wavelength, which falls into the overlapped wavelength band and of a desired amplitude, wherein the first optical filter and the second optical filter are tunable relative to each other;
externally injecting the second plurality of optical pulses into the second laser diode; and
of generating optical pulses primarily of the desired optical wavelength.

* * * * *